(12) United States Patent
Zhang et al.

(10) Patent No.: US 9,993,948 B2
(45) Date of Patent: *Jun. 12, 2018

(54) SUPERHYDROPHOBIC FILMS

(71) Applicant: 3M INNOVATIVE PROPERTIES COMPANY, St. Paul, MN (US)

(72) Inventors: Jun-Ying Zhang, Perrysburg, OH (US); Terry L. Smith, Roseville, MN (US); Berkan K. Endres, St. Paul, MN (US); Mark K. Debe, Stillwater, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 418 days.

This patent is subject to a terminal disclaimer.

(21) Appl. No.: 14/737,565

(22) Filed: Jun. 12, 2015

(65) Prior Publication Data

US 2015/0273733 A1  Oct. 1, 2015

Related U.S. Application Data

(62) Division of application No. 13/280,939, filed on Oct. 25, 2011, now Pat. No. 9,085,019.

(Continued)

(51) Int. Cl.
*B29C 33/42* (2006.01)
*C23F 4/00* (2006.01)
(Continued)

(52) U.S. Cl.
CPC .............. *B29C 33/42* (2013.01); *B08B 17/06* (2013.01); *B08B 17/065* (2013.01);
(Continued)

(58) Field of Classification Search
CPC ..... B29C 33/42; B29C 33/3857; B29C 41/50; B29C 41/02; B29C 41/20; C23F 4/00; B08B 17/06; B08B 17/065; B82Y 40/00; B81C 1/00404; B81C 1/00111; B81C 1/00531; B81C 2105/124; B81C 2905/00; B29K 2105/124; B29K 2905/00;
(Continued)

(56) References Cited

U.S. PATENT DOCUMENTS

| 4,812,352 A | 3/1989 | Debe |
| 5,039,561 A | 8/1991 | Debe |

(Continued)

FOREIGN PATENT DOCUMENTS

| CA | 2323719 | 4/2001 |
| CN | 101474895 | 1/2009 |

(Continued)

OTHER PUBLICATIONS

ASTM D968-05, "Standard Test Methods for Abrasion Resistance of Organic Coatings by Falling Abrasive", (2010).

(Continued)

*Primary Examiner* — Anita K Alanko
(74) *Attorney, Agent, or Firm* — Emily V. Hargett; James A. Baker

(57) ABSTRACT

Superhydrophobic films and methods of making such films are disclosed. More particularly, superhydrophobic films having durable nanostructures with high contrast ratios and various methods of producing such films are disclosed.

6 Claims, 10 Drawing Sheets

Related U.S. Application Data

(60) Provisional application No. 61/407,813, filed on Oct. 28, 2010.

(51) Int. Cl.
*B29C 41/50* (2006.01)
*B29C 41/02* (2006.01)
*B29C 41/20* (2006.01)
*B29C 33/38* (2006.01)
*B08B 17/06* (2006.01)
*B82Y 40/00* (2011.01)
*B81C 1/00* (2006.01)
*B29K 105/12* (2006.01)
*B29K 83/00* (2006.01)
*B32B 3/30* (2006.01)
*B29L 7/00* (2006.01)

(52) U.S. Cl.
CPC .......... *B29C 33/3857* (2013.01); *B29C 41/02* (2013.01); *B29C 41/20* (2013.01); *B29C 41/50* (2013.01); *B82Y 40/00* (2013.01); *C23F 4/00* (2013.01); *B29K 2083/00* (2013.01); *B29K 2105/124* (2013.01); *B29K 2905/00* (2013.01); *B29K 2995/0093* (2013.01); *B29L 2007/001* (2013.01); *B32B 3/30* (2013.01); *B81C 1/00111* (2013.01); *B81C 1/00404* (2013.01); *B81C 1/00531* (2013.01); *Y10T 428/24355* (2015.01)

(58) Field of Classification Search
CPC ........ B29K 2083/00; B29K 2995/0093; Y10T 428/24355; B32B 3/30; B29L 2007/001
See application file for complete search history.

(56) References Cited

U.S. PATENT DOCUMENTS

| | | | |
|---|---|---|---|
| 5,674,592 A | 10/1997 | Clark | |
| 6,136,412 A | 10/2000 | Spiewak | |
| 6,326,723 B1 | 12/2001 | Raj | |
| 7,323,514 B2 | 1/2008 | Jing | |
| 8,115,920 B2 * | 2/2012 | Zhang | B82Y 15/00 356/301 |
| 2003/0187170 A1 | 10/2003 | Burmeister | |
| 2006/0057307 A1 | 3/2006 | Matsunaga | |
| 2006/0078724 A1 | 4/2006 | Bhushan et al. | |
| 2007/0075390 A1 | 4/2007 | Sundstrom | |
| 2007/0298216 A1 | 12/2007 | Jing | |
| 2008/0090010 A1 | 4/2008 | Zhang | |
| 2008/0107864 A1 | 5/2008 | Zhang | |
| 2008/0143019 A1 * | 6/2008 | Chou | B29C 59/022 264/293 |
| 2008/0149488 A1 * | 6/2008 | Lee | B82Y 10/00 205/127 |
| 2008/0199659 A1 * | 8/2008 | Zhao | C03C 17/28 428/161 |
| 2008/0296260 A1 | 12/2008 | Tserepi et al. | |
| 2008/0315459 A1 | 12/2008 | Zhang | |
| 2009/0250588 A1 | 10/2009 | Robeson et al. | |
| 2010/0028604 A1 | 2/2010 | Bhushan | |
| 2010/0047523 A1 | 2/2010 | Kim | |
| 2010/0189992 A1 | 7/2010 | Kusuura | |
| 2010/0284275 A1 * | 11/2010 | Martinez | H04L 65/602 370/231 |
| 2011/0287203 A1 * | 11/2011 | Victor | B29C 37/0053 428/36.9 |
| 2015/0026952 A1 * | 1/2015 | Taboryski | B29C 33/3857 29/458 |

FOREIGN PATENT DOCUMENTS

| | | |
|---|---|---|
| CN | 101537682 | 9/2009 |
| DE | 19950452 | 4/2001 |
| DE | 201 14 878 | 3/2002 |
| WO | WO 2007/075390 | 7/2007 |
| WO | WO 2009/002644 A2 | 12/2008 |
| WO | WO 2009/158046 | 12/2009 |
| WO | WO 2010/022107 | 2/2010 |

OTHER PUBLICATIONS

Barthlott, "Purity of the Sacred Lotus, or Escape From Contamination in Biological Surfaces", Planta 202, 1997, pp. 1-8.
Bernhard, "A Corneal Nipple Pattern in Insect Compound Eyes", Acta Physiologica. Scandinavica, 1962, vol. 56, pp. 385-386.
Blossey, "Self-Cleaning Surfaces—Virtual Realities", Nature Materials, May 2003, vol. 2, pp. 301-306.
Busscher, "Adhesion and Spreading of Human Fibroblasts on Superhydrophobic Fep-Teflon", Cells and Materials, vol. 1, No. 3, pp. 243-249, 1991.
Cao, "Preparation of Material Surface Structure Similar to Hydrophobic Structure of Lotus Leaf", Journal of Wuhan University of Technology—College of Material Science and Engineering, Nanjing University of Technology, vol. 23, No. 4, pp. 513-517, (2008).
Chen, "Ultrahydrophobic and Ultralyophobic Surfaces: Some Comments and Examples", Langmuir, 1999, vol. 15, No. 10, pp. 3395-3399.
Cheng, "Microscopic Observations of Condensation of Water on Lotus leaves", Applied Physics Letters, 2005, vol. 87, pp. 194112-1-194112-3.
Choi, "A Geometry Controllable Approach for the Fabrication of Biomimetic Hierarchical Structure and Its Superhydrophobicity With Near-Zero Sliding Angle", Nanotechnology 19, 2008, 275305, 5 pages.
Debe, "The Interface Orientation of Perylene Red and Phthalocyanine Molecules Vapor Deposited on Aluminium", J. Vac. Sci. Technol., 21(1), May/Jun. 1982 pp. 74-79.
Debe, "Extracting Physical Structure Information from Thin Organic Films with Reflection Absorption Infrared Spectroscopy", J. Appl. Phy., 55(9), pp. 3354-3366, May 1, 1984.
Debe, "Postdeposition growth of a uniquely nanostructured organic film by vacuum annealing" J. Vac. Sci. Tech. A 12 (4) (1994) pp. 2017-2022.
Debe, "Structural characteristics of a uniquely nanostructured organic thin film" J. Vac. Sci. Tech. B 13 (3) (1995) pp. 1236-1241.
Doshi, "Characterization and optimization of absorbing plasma-enhanced chemical vapour deposited antireflection coatings for silicon photovoltaics", Applied Optics, vol. 36, No. 30, Oct. 20, 1997.
Erbil, "Transformation of a Simple Plastic Into a Superhydrophobic Surface", Science, Feb. 28, 2003, vol. 299, pp. 1377-1380.
Feng, "Super-Hydrophobic Surfaces: From Natural to Artificial", Advanced Materials, Dec. 17, 2002, vol. 14, No. 24, pp. 1857-1860.
Gao, "'Artificial Lotus Leaf' Prepared Using a 1945 Patent and a Commercial Textile", Langmuir 2006, vol. 22, pp. 5998-6000.
Gelest, "Silane Coupling Agents: Connecting Across Boundaries", Gelest, Inc. © 2006, 60 pages.
Gombert, "Subwavelength-Structured Antireflective Surfaces on Glass" Thin Solid Films 351, 1999, pp. 73-78.
Hadobas, "Reflection Properties of Nanostructure-Arrayed Silicon Surfaces", Nanotechnology, 2000, vol. 11, pp. 161-164.
Henoch, "Turbulent Drag Reduction Using Superhydrophobic Surfaces", 3rd AIAA Flow Control Conference, Jun. 5-8, 2006, San Francisco, California, American Institute of Aeronautics—3192, 5 pages.
Huang, "Improved Broadband and Quasi-Omnidirectional Anti-Reflection Properties With Biomimetic Silicon Nanostructures" Nature Nanotechnology, Dec. 2007, vol. 2, pp. 770-774.
Jin, "Superhydrophobic Aligned Polystyrene Nanotube Films with High Adhesive Force", Advanced Materials, 205, vol. 17, pp. 1977-1981.

(56) References Cited

OTHER PUBLICATIONS

Kasugai, "High-Efficiency Nitride-Based Light-Emitting Diodes With Moth-Eye Structure", Japanese Journal of Applied Physics, vol. 44, No. 10, pp. 7417-7417, (2005).
Kim, "Focused Ion Beam Nanopatterning for Optoelectronic Device Fabrication", IEEE Journal of Selected Topics in Quantum Electronics, vol. 11, No. 6, pp. 1292-1298, (2005).
Kobayashi, "Self-assembly of Fine Particles Applied to the Production of Antireflective Surfaces", International Journal of Precision Engineering and Manufacturing, vol. 9, No. 1, pp. 25-29, (2008).
Koo, "A Snowman-like Array of Colloidal Dimers for Antireflecting Surfaces", Advanced Materials, Feb. 3, 2004, vol. 16, No. 3, pp. 274-277.
Kuo, "Optimization of the Electron-Beam-Lithography Parameters for the Moth-Eye Effects of an Antireflection Matrix Structure", Journal of Applied Polymer Science, vol. 102, pp. 5303-5313, (2006).
Ling, "Stable and Transparent Superhydrophobic Nanoparticle Films", Langmuir 2009, vol. 25, 3260-3263.
Linn, "Self-Assembled Biomimetic Antireflection Coatings", Applied Physics Letters, 2007, vol. 91, pp. 101108-101108-3.
Min, "Bio-inspired Self-Cleaning Antireflection Coatings" Advanced Materials, 2008, vol. 20, pp. 1-5.
Min, "Large-Scale Assembly of Colloidal Nanoparticles and Fabrication of Periodic Subwavelength Structures", Nanotechnology, 2008, vol. 19, 7 pages.
Misra, "Nonwetting, Nonrolling, Stain Resistant Polyhedral Oligomeric Silsesquioxane Coated Textiles", Journal of Applied Polymer Science, vol. 115, pp. 2322-2331 (2010), © 2009 Wiley Periodicals, Inc.
Nishino, "The Lowest Surface Free Energy Based on—$CF_3$ Alignment", Langmuir 199, vol. 15, pp. 4321-4323.
Onër, "Ultrahydrophobic Surfaces. Effects of Topography Length Scales on Wettability", Langmuir 2000, vol. 16, 7777-7782.
Prevo, "Assembly and Characterization of Colloid-Based Antireflective Coatings on Multicrystalline Silicon Solar Cells", Journal of Materials Chemistry, vol. 17, pp. 791-799 (2007).
Qian, "Fabrication of Superhydrophobic Surfaces by Dislocation-Selective Chemical Etching on Aluminium, Copper, and Zinc Substrates", Langmuir, 2005, vol. 21, No. 20, pp. 9007-9009.
Sasaki, "Processing and properties of transparent super-hydrophobic polymer film with low surface electric resistance", Journal of Materials Science, vol. 39 (2004), pp. 3717-3722, © Kluwer Academic Publishers.
Shibuichi, "Super Water-Repellent Surfaces Resulting From Fractal Structure", Journal of Physical Chemistry, vol. 100, No. 50, pp. 19512-19517 (1996).
Sun, "Biometric subwavelength antireflective gratings on GaAs", Optics Letters, vol. 33, No. 19, Oct. 1, 2008.
Sun, "Artificial Lotus Leaf by Nanocasting", Langmuir, 2005, vol. 21, No. 19, pp. 8978-8981.
Sun, "Broadband Moth-Eye Antireflection Coatings on Silicon", Applied Physics Letters, 2008, vol. 92, pp. 061112-1-061112-3.
Sun, "Fabrication of Super-Hydrophobic Film With Dual-Size Roughness by Silica Sphere Assembly", Thin Solid Films 515, 2007, pp. 4686-4690.
Takeda, "Preparation of transparent super-hydrophobic polymer film with brightness enhancement property", Journal of Materials Science Letters, vol. 20, 2001, pp. 2131-2133, © 2001 Kluwer Academic Publishers.
Takeshita, "Simultaneous Tailoring of Surface Topography and Chemical Structure for Controlled Wettability", Langmuir 2004, vol. 20, 8131-8136.
U.S. Appl. No. 61/407,820, entitled "Superhydrophobic Films", filed Oct. 28, 2010.
U.S. Appl. No. 61/407,806, entitled "Superhydrophobic Film Constructions", filed Oct. 28, 2010.
Wu, "Deformable Antireflection Coatings from Polymer and Nanoparticle Multilayers", Advanced Materials, 2006, vol. 18, pp. 2699-2702.
Xi, "The preparation of lotus-like super-hydrophobic copper surfaces by electroplating", Applied Surface Science 255 (2009), pp. 4836-4839.
Xue-Mei, "What do we need for a superhydrophic surface? A review on the recent progress in the preparation of superhydrophobic surfaces", Chemical Society Reviews, 2007, vol. 36, pp. 1350-1368.
Yancey, "Influence of Void Space on Antireflection Coatings of Silica Nanoparticle Self-Assembled Films", Journal of Applied Physics, vol. 99, pp. 034313-1-034313-10, (2006).
Zhang, "Superhydrophobic Behavior of a Perfluoropolyether Lotus-Leaf-Like Topography", Langmuir 2006, vol. 22, 8576-8580.
Zhang, "Superhydrophobic Surfaces: From Structural Control to Functional Application", Journal of Materials Chemistry, vol. 18, pp. 621-633, (2008).
Zhao, "19.8% Efficient "Honeycomb" Textured Multicrystalline and 24.4% Monocrystalline Silicon Solar Cells", Applied Physics Letters, Oct. 5, 1998, vol. 73, No. 14, pp. 1991-1993.
Zhao, "22.7% Efficient Silicon Photovoltaic Modules With Textured Front Surface", IEEE Transactions on Electron Devices, Jul. 1999, vol. 46, No. 7, pp. 1495-1497.
Zhao, "Superhydrophobic Polyimide Films with a Hierarchical Topography: Combined Replica Molding and Layer-by-Layer Assembly", Langmuir, 2008, vol. 24, No. 21, pp. 12651-12657.
Zhu, "Tuning wettability and getting Superhydrophobic surface by controlling surface roughness with well-designed microstructures", Sensors and Actuators A, 130-131, (2006) pp. 595-600.
Merriam-Webster Online Dictionary, Prism Definition, Jun. 27, 2007, http://www.merriam-webster.com/dictionary/prism.
Cortese et al, Superhydrophobicity Due to the Hierarchical Scale Roughness of PDMS Surfaces, 2008, Langmuir, 24, 2712-2718.
Bhushan et al, Micro-, nano- and hierarchical structures for superhydrophobicity, self-cleaning and low adhesion, 2009, Phil. Trans. R. Soc. A, 367, 1631-1672.

* cited by examiner

SUPERHYDROPHOBIC FILMS

CROSS REFERENCE TO RELATED APPLICATIONS

This application is a divisional of U.S. application Ser. No. 13/280,939, filed Nov. 25, 2011, now allowed, which claims the benefit of U.S. Provisional Application No. 61/407,813, filed Nov. 28, 2010, the disclosures of which are incorporated by reference in their entirety herein.

FIELD

The present description relates to superhydrophobic films. More particularly, the present description relates to superhydrophobic films having durable nanostructures with high aspect ratios, and method of producing such films.

BACKGROUND

Hydrophobic films and coatings, and more particularly, superhydrophobic films and coatings have garnered considerable attention in recent years due to a number of attractive qualities. Highly hydrophobic surfaces have been recognized in nature, perhaps most prevalently on lotus leaves and also on cicada wings. Because of its hydrophobic properties, the lotus leaf is capable of self-cleaning by the washing away of dust particles and debris as water droplets roll off its surface. This ability to self-clean is desirable in a number of modern-day applications. In part, hydrophobicity may be tied to the surface structure of a given film, where small and thin nanoposts or nanocavities with high aspect ratios, or thin "whisker-like" structures or cavities may dramatically increase hydrophobicity. However, it is difficult to produce films that have nanoposts or nanocavities with very high aspect ratios in a number of different materials. The current description provides for such films as well as method of producing such films.

SUMMARY

In one aspect, the present description relates to a superhydrophobic film. The superhydrophobic film has a first major surface, and a second major surface opposite the first major surface. The second major surface is made up in part of a plurality of microstructures into which a plurality of narrow nanocavities are formed. These nanocavities have a length-to-opening ratio of at least 5 to 1. The superhydrophobic film has a water contact angle of over 150 degrees and a sliding angle of less than 3 degrees.

In a second aspect, the present description relates to a superhydrophobic film. The superhydrophobic film has a first major surface, and a second major surface opposite the first major surface. The second major surface is made up in part of a plurality of microstructures, where a plurality of nanoposts protrude from the surface of the microstructures. These nanoposts have a length-to-base ratio of at least 5 to 1, and the film has a water contact angle of over 150 degrees and a sliding angle of less than 3 degrees.

In another aspect, the present description relates to a method of creating a superhydrophobic film. The method involves the first step of providing a first film, where the film includes a plurality of microstructures on a first surface of the film. Next a layer of nanoposts that protrude from the first film is applied. The first film is coated with a curable composition, and the composition is cured to create a negative of the first film. The negative is separated from the film, but the nanoposts remain embedded in the negative after separation. Finally, the negative is etched. The result is superhydrophobic film with a plurality of microstructures and nanoposts, where the nanoposts have a length-to-base ratio of at least 5 to 1.

In a different aspect, the present description relates to a method of creating a superhydrophobic film. The method includes the step of providing a first film, where the first film has a plurality of microstructures on a first surface of the film. On each of the microstructures is a layer of nanoposts. Next, the first film is coated with a metal coating to create a metal mold of the first film. The mold is separated from the first film, but the nanoposts remain embedded in the metal mold after separation. The mold is etched, such that the nanoposts embedded in the metal mold are etched away. The result is a metal mold with nanocavities in the mold. Finally, the metal mold is coated with a curable composition, which is subsequently cured and separated from the metal mold. The result is a superhydrophobic film.

In a final aspect, the present description relates to a method of creating a superhydrophobic film. The method involves the first step of providing a first film, where the film includes a plurality of microstructures on a first surface of the film. Next a layer of nanoposts that protrude from the first film is applied. The first film is coated in a curable composition, and the composition is cured to create a negative of the first film. The negative is separated from the film, but the nanoposts remain embedded in the negative after separation. Finally, the negative is etched. In this method, the nanoposts etch at a faster rate than the negative. The result is superhydrophobic film with a plurality of microstructures and nanocavities, where the nanocavities have a length-to-opening ratio of at least 5 to 1.

DETAILED DESCRIPTION

Figure 1:
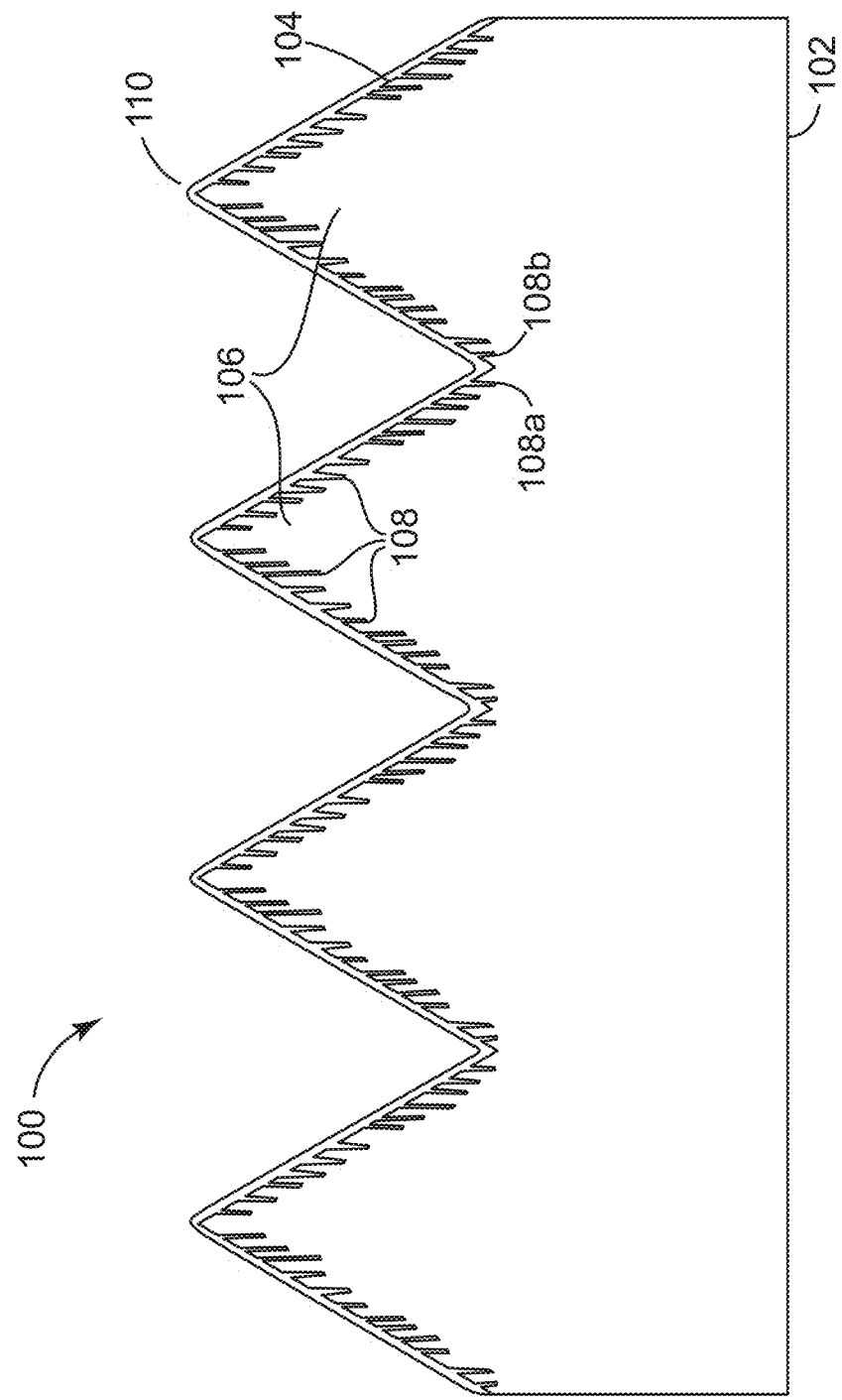
FIG. 1 is a cross-sectional view of a superhydrophobic film according to the present description.

Superhydrophobic films and surfaces are very desirable in a number of applications due to their ability to self-clean. Generally, a film may be considered "superhydrophobic" where the water contact angle is greater than 140 degrees. Superhydrophobic films may further be understood as generally nonwettable, as water beads off of the surface of the film upon contact. A further desirable quality for such films may be low contact angle hysteresis, that is, a small difference between the advancing and receding contact angles of the water droplet. A low contact angle hysteresis, or "sliding angle" allows for water beads to roll off of the surface of a film or other construction more easily. The combination of the ability to bead water that comes into contact with the surface of a structure and further roll the beaded water off of the surface is what makes the surface "self-cleaning."

This ability to self-clean is desirable in a number of modern-day applications. For example, self-cleaning superhydrophobic surfaces may be useful on the sun-facing surfaces of solar (photovoltaic) cells, anti-icing applications, corrosion prevention, anti-condensation applications, wind blades, traffic signals, edge seals, anti-fouling applications, and drag reduction and/or noise reduction for automobiles, aircraft, boats and microfluidic devices, just to name a few. Such films may also have valuable anti-reflection properties. There have therefore been attempts to create superhydrophobic films either by microstructuring a film's surface in a manner resembling that of the lotus leaf, coating the film with a hydrophobic chemical coating, or a combination thereof. In the case of microstructuring the surface of a film, one particularly effective surface is one which exhibits either nanoposts with very large height to width ratios or nanocavities with very large depth to width ratios (or whisker-like cavities and structures). Unfortunately, in a number of materials, it is difficult to form such structures or cavities, and difficult to hold the shape of such structures after placing films in the elements. The present description provides an article that exhibits the useful features of whisker-like cavities and structures in a number of different materials, as well as a number of methods for producing such films.

Two of the most important measurements in determining just how superhydrophobic a film or coating is are that of water contact angle and sliding angle (or contact angle hysteresis). The water contact angle may be measured with a static contact angle measurement device, such as the Video Contact Angle System: DSA100 Drop Shape Analysis System from Kruess GmbH (Hamburg, Germany). In this particular system, a machine is equipped with a digital camera, automatic liquid dispensers, and sample stages allowing a hands-free contact angle measurement via automated placement of a drop of water (where the water drop has a size of approximately 5 µl). The drop shape is captured automatically and then analyzed via Drop Shape Analysis by a computer to determine the static, advancing, and receding water contact angle. Static water contact angle may be generally understood as the general "water contact angle" described and claimed herein.

Figure 6A:
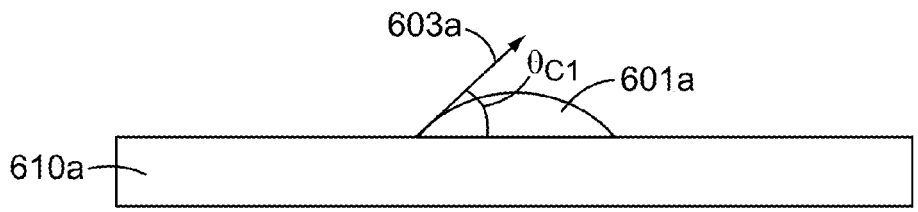
FIGS. 6a-d provide illustrations of water droplets as related to measuring water contact angle, advancing angle, and receding angle.
Figure 6B:
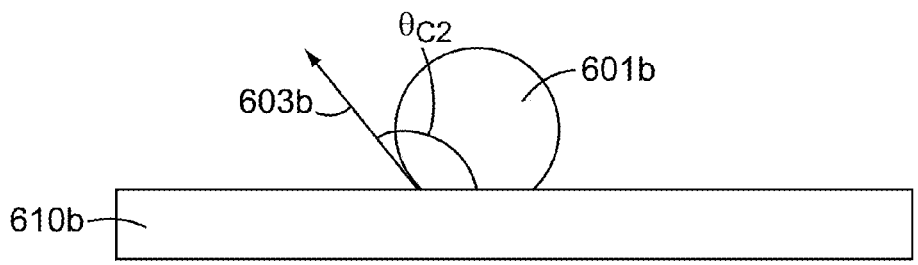

The water contact angle may most simply be understood as the angle at which a liquid meets a solid surface. As shown in FIG. 6a, where a surface of film 610a is not very hydrophobic, the water drop 601a will flatten on the surface. A tangential line 603a may be drawn from interface point of the drop along the edge of the drop. The contact angle $\theta_{C1}$ is the angle between this tangent line 603a, and the plane of the drop 601a and film 610a interface. FIG. 6a shows a water droplet that is not beading along the surface and therefore a contact angle $\theta_{C1}$ that is well below 90 degrees. Conversely, film 610b in FIG. 6b is hydrophobic. As such, the water droplet 601b experiences more of a beading effect off of the surface. Therefore the tangent line 603b along the drop's edge angles out away from the drop, and a water contact angle $\theta_{C2}$ of greater than 90 degrees, and potentially greater than 140 or 150 degrees is achieved.

Figure 6C:
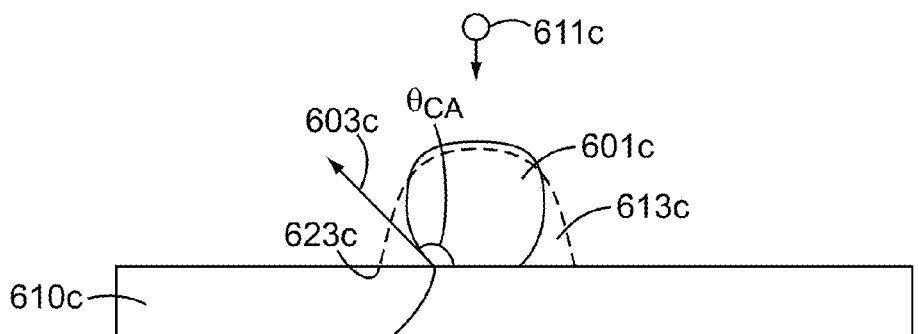
Figure 6D:
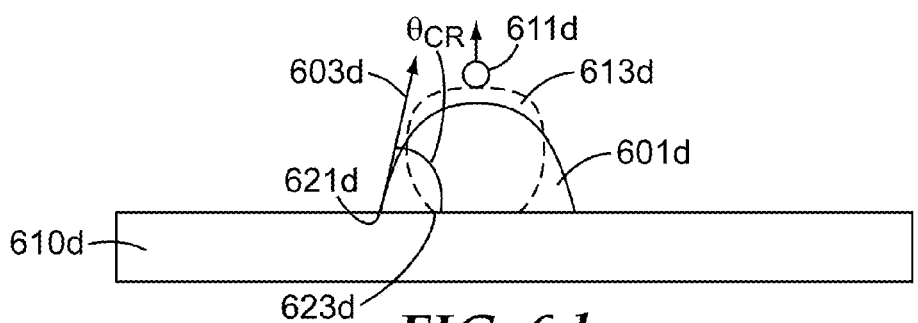

The "sliding angle" or "contact angle hysteresis" is defined as the difference between the advancing and receding water contact angles. Advancing water contact angle and receding water contact angles relate not just to static conditions, but to dynamic conditions. With reference to FIG. 6c, the advancing water contact angle $\theta_{CA}$ is measured by adding further water volume 611c into the drop 601c. As more water is added, the droplet increases in volume and the water contact angle also increases. When a critical volume is reached, the intersection of the droplet surface with the film will jump outward such that droplet 601c will reform into a droplet with shape 613c, and the intersection of the droplet and film surfaces will move from position 621c to position 623c. The water contact angle $\theta_{CA}$ is the angle of the drop immediately before the intersection jumps. In the same vein, water receding angle is shown in FIG. 6d. Here the higher volume drop has water 611d slowly removed from it. The surface of initial drop 601d intersects the film 610d at position 621d. At a given volume, the intersection jumps to position 623d. The tangent line 603d that traces the edge of the drop immediately before this jump defines the receding water contact angle $\theta_{CR}$.

As noted, ability to create microstructures and nanostructures on a surface may contribute to the surface having a greater hydrophobicity. In particular, microstructures or nanostructures having high aspect ratios may provide very superhydrophobic surfaces. One manner of creating high aspect ratio structures is through the use of self-assembling material films. Further description of such self-assembling films is provided in commonly owned and assigned U.S. Pat. No. 5,674,592. However, the particular materials used and described in this specification in order to create high aspect ratio structures are not durable. Therefore, where such materials are used to create a superhydrophobic surface, any amount of exposure to weathering conditions will result in damage or destruction to the nanostructures. The present description aims to provide the benefit of the high aspect ratio features in question provided into a durable material.

Besides the very high superhydrophobic performance of the currently described films, other useful properties may be exhibited. For example, the films described herein may exhibit very low reflectivity and therefore be highly transmissive. This is a highly beneficial property for applications where films are applied to solar cells, or any sort of window or light transmissive usage where the films are used for self-cleaning or anti-icing properties. The films described herein may reflect less than 5% of incident light, and may reflect less than 2% of incident light. In some application, only approximately 1% of light incident on the films is reflected.

A superhydrophobic film according to one embodiment of the present description is illustrated in FIG. 1. Superhydrophobic film 100 is made up of both a first major surface 102 and a second major surface 104. First major surface 102 may be a flat surface in a number of embodiments, or may be a matte surface, or other type of structured surface. In some embodiments, first major surface 102 may be adhered to another film or surface, and in others the surface interfaces with air. The second major surface 104 is on the opposite side of the film 100 from first major surface 102. The second major surface may be made up of a plurality of microstructures 106. In FIG. 1, the microstructures 106 are prisms. However, a number of different microstructure shapes and patterns are contemplated in the present description, such as those illustrated in FIGS. 2a-c, where the microstructures 106 may be prisms (FIG. 2a) microlenses (FIG. 2b), or a pattern that mimics sharkskin (FIG. 2c), amongst a number of other shapes and patterns. In addition, microstructures of any shape may be varied in three different dimensions.

Figure 9A:
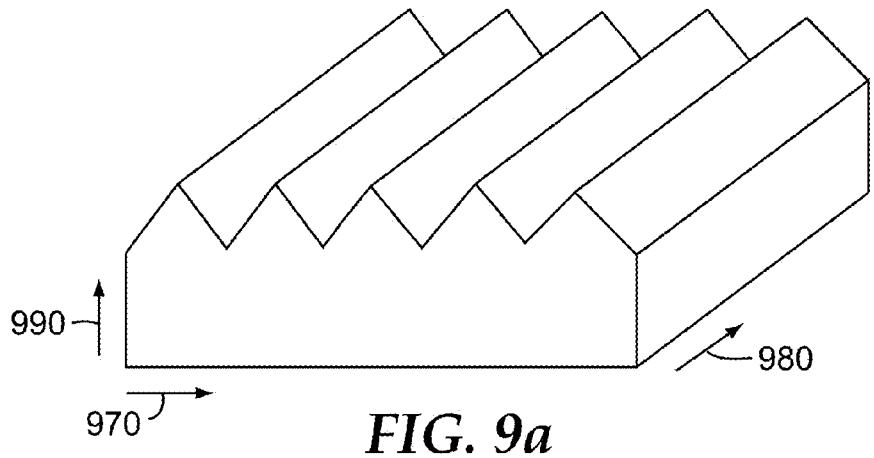
FIGS. 9a-c are different microstructure distributions for a superhydrophobic film.
Figure 9B:
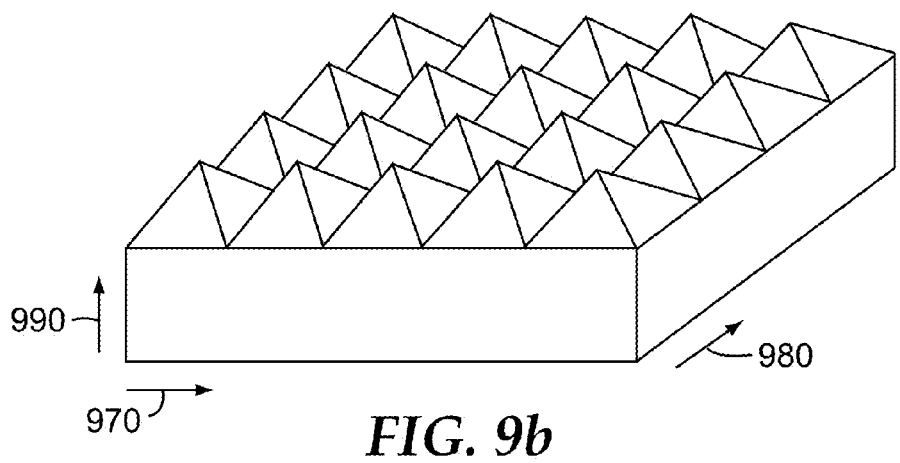
Figure 9C:
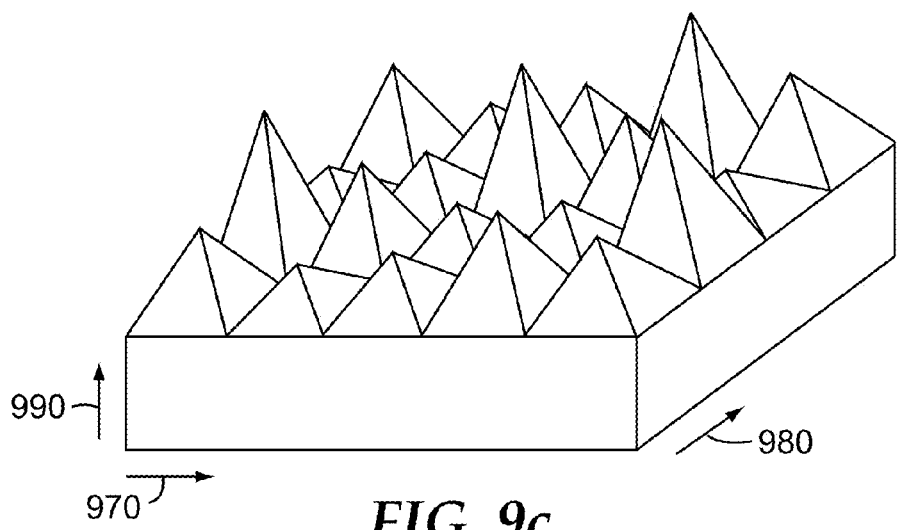
Figure 10:
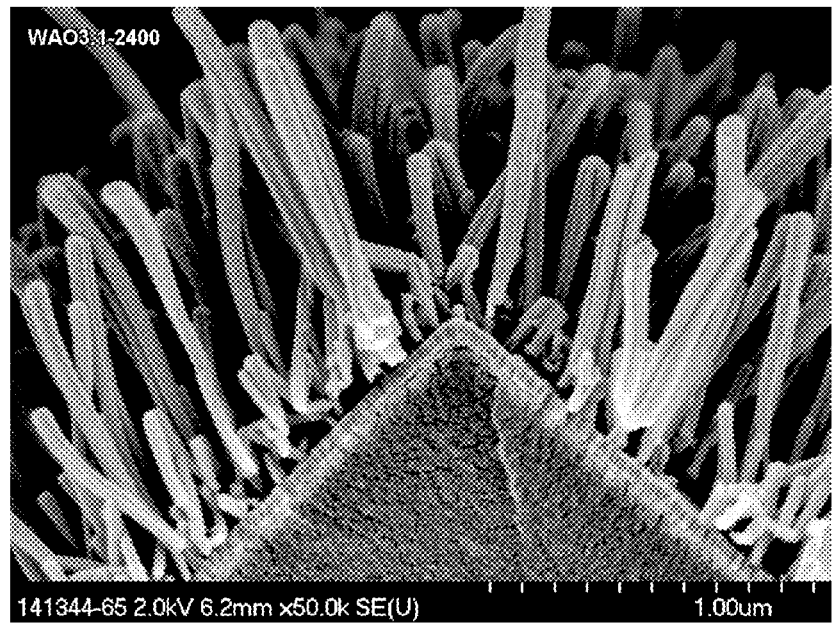
FIG. 10 is a SEM image of coated nanoposts according to the present description.

A better understanding of this may be gained by reference to FIGS. 9a-c. For example in FIG. 9a, the microstructures may be structures that identically run the length 980 of the film at the same height along the vertical direction 990 without any segmentation. However, across the width 970 of the film, or across a first dimension, the film is segmented into different discrete microstructures. In addition, as shown in FIG. 9b, the microstructure may vary in two directions. For example, the structures may be segmented as in FIG. 9a along the width 970 of the film, but also be segmented along the length 980 of the film (or second dimension). In such a case, discrete prisms are located along both axes. Here, however, the structures are all the same height in the vertical direction (or third dimension) 990. Finally, as shown in FIG. 9c, the structures may be segmented along both the width and length of the film, but may also vary in the height of the microstructures across the film in the vertical direction 990 (or third dimension). In any of these three scenarios the microstructures may be directly adjacent to one another or may be spaced apart by some portion of film that is flat. The microstructures may contain any combination of linear, curved (such as spherical, hemispherical or parabolic), or other geometries, in any of the three dimensions. For example, they could be a series of round posts protruding from a portion of flat film.

Microstructures may also have any appropriate set of dimensions. For example, microstructures may have a height of between 0.15 microns and about 1,000 microns. Microstructures may further fall within a narrower range of between about 1 micron and about 500 microns. Adjacent microstructures may be spaced a distance of between about 0.15 microns and about 1000 microns. Microstructures may further have a base width of between about 0.15 microns and about 1,000 microns, or more narrowly between about 1 micron and about 500 microns.

A number of embodiments as illustrated by the figures herein may include microstructures that are directly adjacent to one another, such that the base of a microstructure is directly in contact with the base of an adjacent microstructure. However, it should be understood that the microstructures may be further spaced apart, such that the facets of the microstructures are not in contact and are spaced apart by a segment of film surface that may, for example, be flat. This film surface that lies between the microstructures may also have the nanocavities or nanoposts on its surface that are present on the microstructures, as discussed below. In fact, there may be such space between the microstructures that they have an average peak-to-peak distance of adjacent microstructures up to about 5 times the average height of the microstructures.

Figure 3A:
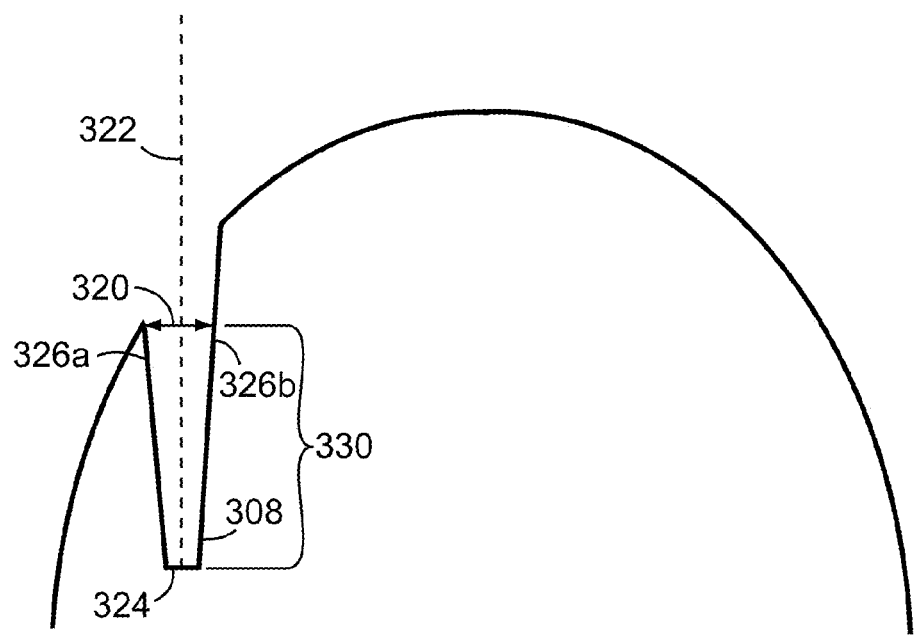
FIGS. 3a-b are cross-sectional views of a nanocavity and a nanopost.

Returning to FIG. 1, once again the film 100 has a number of microstructures 106. In one embodiment, each of the structures 106 has a plurality of narrow nanocavities 108 that are formed into the surface of the plurality of microstructures 106. The nanocavities 108 will generally have a very high aspect ratio, and very high "length-to-opening" ratio. A better understanding of this may be gained by reference to FIG. 3a. Nanocavity 308 has a width 320 that may be understood as the maximum width of the nanocavity 308 in a plane perpendicular to the cavity axis 322 that is furthest from the base of the cavity 324 and still intersects all side walls 326a and 326b of the cavity. The length of the nanocavity 330 is the distance to this same point along the cavity axis from the base of the cavity 324. Dividing the length 330 by the opening width 320 provides the length-to-opening ratio of a given nanocavity 308. By adding all of the length-to-opening ratios and dividing by the number of nanocavities of the film, the average length-to-opening ratio may be determined. In some embodiments of a film according to the present description, the average length-to-opening ratio may be at least 3 to 1, or at least 5 to 1, or 10 to 1 or 15 to 1, or even at least 20 to 1.

The importance of water contact angle and sliding angle were discussed at length above. The films of the present description are especially superhydrophobic and may exhibit very high water contact angles and very low sliding angles. In at least some embodiments, the superhydrophobic film of the present description has a water contact angle of over 150 degrees, and in some embodiments, the water contact angle may be greater than 160 degrees. The sliding angle (or contact angle hysteresis) is also very low in a number of embodiments according to the present description. In some embodiments, the sliding angle of a superhydrophobic film 100 is less than 5 degrees. In a smaller subset of embodiments, the sliding angle of the film may be less than 3 degrees, or even less than 1 degree.

The superhydrophobic film 100 as illustrated in FIG. 1 may be made of any number of suitable materials. In some embodiments according to the present description, the superhydrophobic film is made of a silicone polymer. One silicone polymer that may be used to construct the film that has particularly useful properties is poly(dimethylsiloxane) (PDMS). For example, the film may be a material that is a majority by weight PDMS, or potentially made of at least 95 wt. % PDMS. In other embodiments, the silicone polymer may be silicones in which some of the silicon atoms have other groups that may be aryl, for example phenyl, alkyl, for example ethyl, propyl, butyl or octyl, fluororalkyl, for example 3,3,3-trifluoropropyl, or arylalkyl, for example 2-phenylpropyl. The silicone polymers may also contain reactive groups, such as vinyl, silicon-hydride (Si—H), silanol (Si—OH), acrylate, methacrylate, epoxy, isocyanate, anhydride, mercapto and chloroalkyl. These silicones may be thermoplastic or they may be cured, for example, by condensation cure, addition cure of vinyl and Si—H groups, or by free-radical cure of pendant acrylate groups. They may also be crosslinked with the use of peroxides. Such curing may be accomplished with the addition of heat or actinic radiation. Other useful polymers include polyurethanes, fluoropolymers including fluoroelastomers, polyacrylates and polymethacrylates. In another embodiment, polymers with a glass transition temperature of at least 25 degrees C. are useful. In at least some embodiments, the film may be an elastomer. An elastomer may be understood as a polymer with the property of viscoelasticity (or elasticity) generally having notably low Young's modulus and high yield strain compared with other materials. The term is often used interchangeably with the term rubber, although the latter is preferred when referring to cross-linked polymers.

In at least some embodiments, as show in FIG. 1, the superhydrophobic film 100 may also have fluorochemical coating 110 that is applied to the second major surface 104 and over the nanocavities 108. Exemplary fluorochemical coatings that may be applied to the surface are generally low surface energy coatings. A low surface energy coating may generally be understood as a coating that, on a flat surface, has a water contact angle of greater than 110 degrees. These coatings may be made up of materials that may include hexafluoropropylene oxide (HFPO), or organosilanes such as, alkylsilane, alkoxysilane, acrylsilanes, polyhedral oligomeric silsequioxane (POSS) and fluorine-containing organosilanes, just to name a few. These examples are also appropriate for the fluorochemical coatings described for use in other article and method descriptions provided further below.

Figure 11:
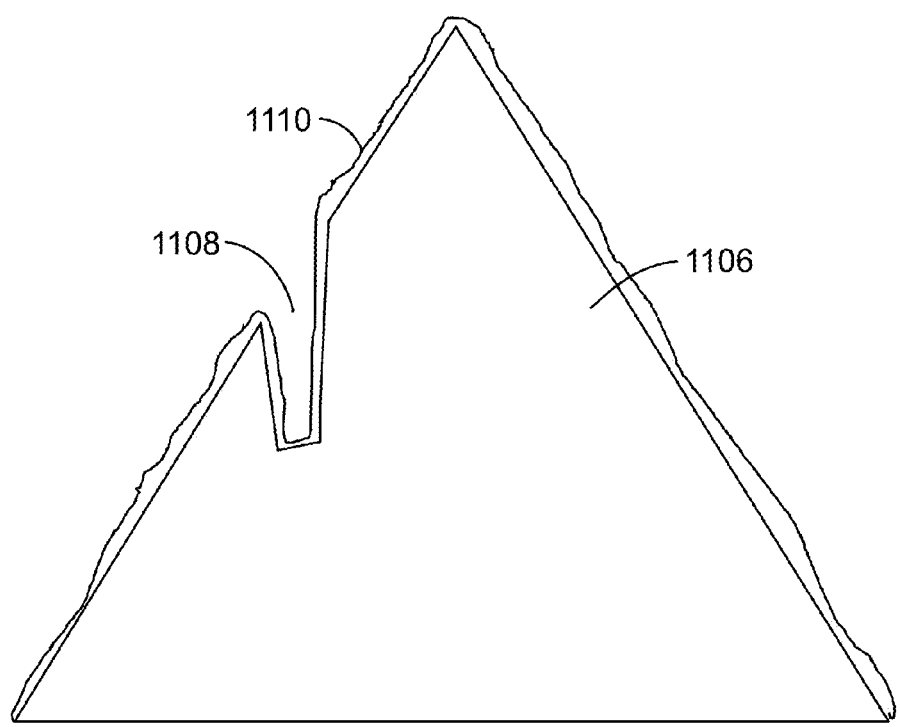
FIG. 11 is a close-up view of a microstructure according to the present description.

Due to the scale of the figure illustrated in FIG. 1, it is difficult to show the manner in which the coating 110 is applied with respect to nanocavities 108. Although FIG. 1 illustrates a flat coating in a plane over the entire second major surface 104, the actual coating appearance, as shown on a micro-scale, is illustrated in FIG. 11. There, coating is applied on the second major surface 1104, but when the coating 1110 reaches a nanocavity 1108 it coats the edge of the cavity 1108 while still maintaining a recess into the microstructure 1104.

Due to the small size of the nanoposts and nanocavities described herein, as well as the high aspect ratios of the two, it is preferable that the coating 110 be of only a certain thickness. For example, as described directly above with respect to the coating 1110 and cavity 1108, the coating should coat the edges of the cavity, but not completely fill the cavity. In the same manner, the coating should coat around the edges of nanoposts, but should not be so thick as to bury the nanoposts entirely, such that the microstructure is not nanofeatured. This would adversely affect the hydrophobicity of the film. Therefore the coating will have a thickness that is smaller than the average height of the nanoposts or depth of the nanocavities. The coating may preferably have a thickness that is less than 100 nm, and potentially even much thinner than this.

In addition, the nanocavities 108 of the superhydrophobic film may have different shapes, especially at the deepest portion of the cavity. For example, in some aspects, the nanocavity may be shaped in a near rectangular shape, or at least a trapezoid, such that the bottom of the nanocavity is flat and does not terminate at a point. Such a nanocavity 108a is illustrated in FIG. 1. In other embodiments, the cavity may terminate at a single point, such that the cavity is a rectangle shape that is needle-like. Such a nanocavity 108b is also illustrated in FIG. 1. Either shape of nanocavity may be characterized properly by their length-to-opening ratio to show the dramatic whisker-like structure of the cavity.

In addition, the film according to the present description may be positioned on a substrate. The film will generally be positioned such that the first major surface is adjacent the substrate. The substrate may be made from any number of suitable materials. For example, in some embodiments, the substrate may be made from the same materials as the film. In other exemplary embodiments, the substrate may be made of polyimide or more commonly used substrates. Specifically, glass, metal or plastic substrates may be appropriate, as well as other suitable alternatives such as silicon wafers.

Figure 2A:
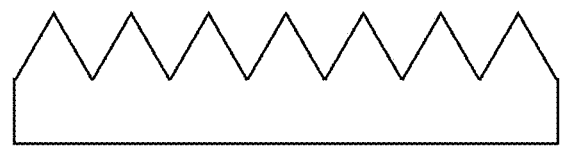
FIGS. 2a-c are cross-sectional views of microstructure shapes for use in a superhydrophobic film.
Figure 2B:
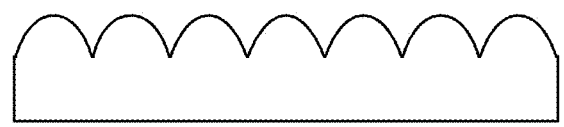
Figure 2C:
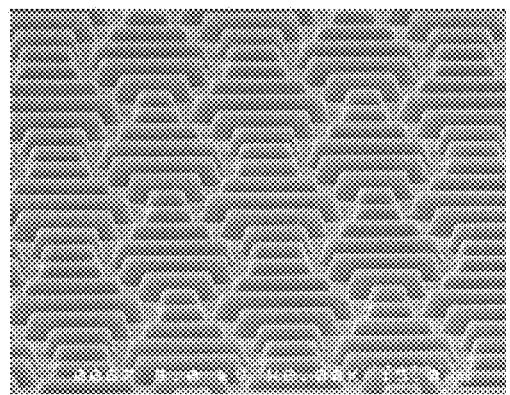
Figure 4:
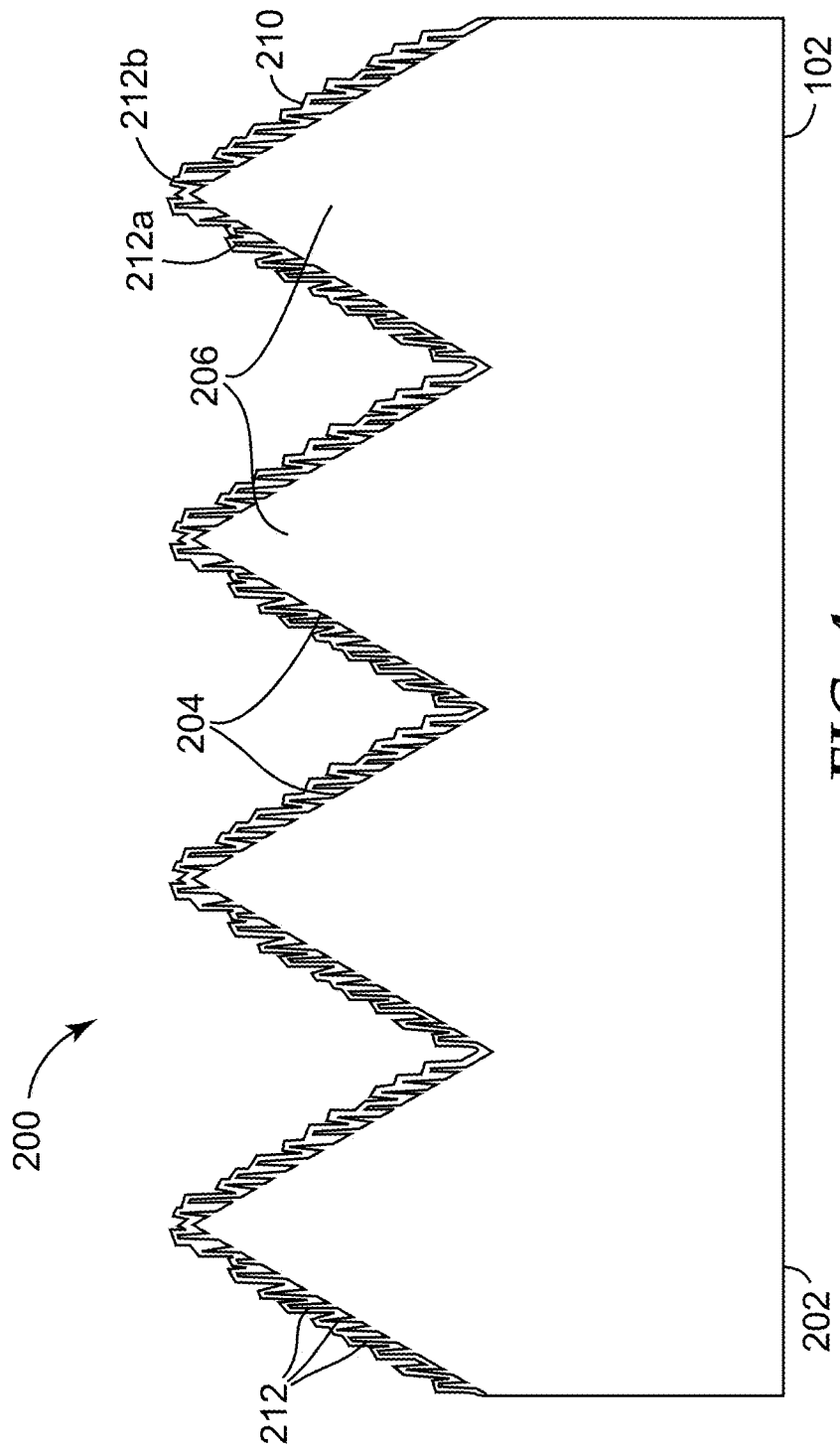
FIG. 4 is a cross-sectional view of a superhydrophobic film according to the present description.

Another embodiment of superhydrophobic films according to the present description is illustrated in FIG. 4. The superhydrophobic film 200 of FIG. 4 also has a first major surface 202 that shares the same characteristics as the first major surface 102 of FIG. 1. The film also a second major surface 204 that is made in part of a plurality of microstructures 206. FIGS. 4 and 2a illustrate that the microstructures of the second surface may be prisms. However, a number of other shapes of microstructures are contemplated, including those illustrated in FIGS. 2b-c. On each of the microstructures 206, there are a plurality of narrow nanoposts 212 that are protruding from microstructures' surface.

Figure 3B:
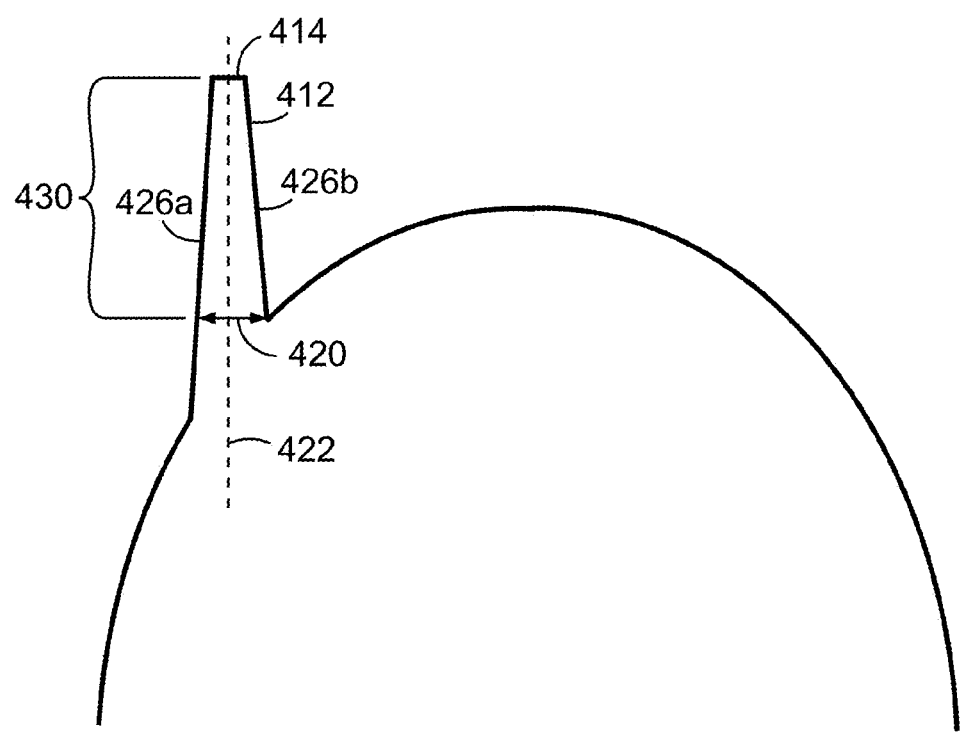

In the same manner that the nanocavities 108 of FIG. 1 have a high length-to-opening ratio on average, the films of the current embodiments that have nanostructures exhibit a "length-to-base" ratio. In order to fully understand this measurement, FIG. 3b provides an illustration. Nanopost 412 has a width 420 at its base that may be understood as the maximum width of the nanopost 412 in a plane perpendicular to the structure axis 422 that is furthest from the peak 414 of the structure and still intersects all side walls 426a and 426b of the nanopost. The length of the nanopost 430 is the distance to this plane along the structure axis from the peak of the structure 414. Dividing the length 430 by base width 420 provides the length-to-base ratio of a given nanopost 412. By adding all of the length-to-base ratios and dividing by the number of nanoposts protruding from the film, the average length-to-base ratio may be determined. In some embodiments of a film according to the present description, the average length-to-base ratio may be at least 3 to 1, or at least 5 to 1, and in some the length-to-base ratio may be at least 10 to 1, or 15 to 1, or even at least 20 to 1.

Although the nanocavities and nanoposts described thus far are generally illustrated as having smooth, or nearly smooth sidewalls, other constructions are also contemplated. The walls of the nanoposts or nanocavities also may have a certain level of roughness. The roughness may in fact be substantial enough that the side walls of the nanoposts or nanocavities appear to be wavy in shape.

In at least some embodiments, the superhydrophobic film as described in accordance with FIG. 4 has a water contact angle of over 150 degrees, and in some embodiments, the water contact angle may be greater than 160 degrees. In some embodiments, the sliding angle of this superhydrophobic film 100 is less than 5 degrees. In a smaller subset of embodiments, the sliding angle of the film may be less than 3 degrees, or even less than 1 degree.

In addition, the nanoposts 212 of the superhydrophobic film may have different shapes, especially at the highest portion of the structure. For example, in some aspects, the nanopost may be shaped in a near rectangular shape, or at least a trapezoid, such that the top of the nanopost is flat and does not terminate at a point. Such a nanopost 212a is illustrated in FIG. 4. In other embodiments, the structure may terminate at a single peak, such that the structure is a triangular shape. Such a nanopost 212b is also illustrated in FIG. 4. Either shape of nanopost may be characterized properly by their length-to-base ratio to show the dramatic whisker-like shape of the structure.

In some embodiments, the microstructures 206 may be made of a silicone polymer, such as PDMS. However, the nanoposts need not be made out of PDMS. In some embodiments, the nanoposts may be made of a fluoropolymer, such as DYNEON FLUOROPOLYMER THV220, for example, or a fluoroelastomer, such as FLUOROELASTOMER FPO3470, for example. In other embodiments, the nanoposts 212 may be formed from a crystalline, organic material. This crystalline, organic material may help contribute to the ability to form a structure with such a great length-to-base ratio. One example of a useful crystalline, organic material for forming nanoposts is N,N'-di(3,5,-xylyl)perylene-3,4:9,10-bis(dicarboximide). This material is an organic pigment that may also be understood by the perylene red (PR149). Greater description of PR149 and other potential materials used for the nanoposts may be found in commonly owned U.S. Pat. No. 5,674,592, the entirety of which is hereby incorporated by reference. Another example of a suitable material may be a perylene dicarboximide derivative. Unfortunately, such materials may not be as durable as desired in a number of conditions in which a superhydrophobic film may be used. Therefore, in some embodiments, the nanoposts 212 may be covered in a metal coating. In at least a subset of these embodiments, the metal may be a slow-etching metal (i.e. one that etches at a slower rate than the material in which it is placed), such as a platinum alloy. One platinum alloy that is appropriate contains platinum, cobalt, and manganese (e.g. $Pt_{68}Co_{29}Mn_3$). Such a metal alloy may also be understood as corresponding to the metals described in the methods and articles described hereinafter. In order to provide the most heightened superhydrophobicity, as shown in FIG. 4, the nanoposts, and potentially the slow-etching metal (e.g. a platinum alloy), may all be covered by a fluorochemical coating 210 (as shown in FIG. 4 on the furthest right microstructure). This fluorochemical may be especially useful in combating any negative effects that the metal exhibits on the hydrophobic performance.

Figure 5:
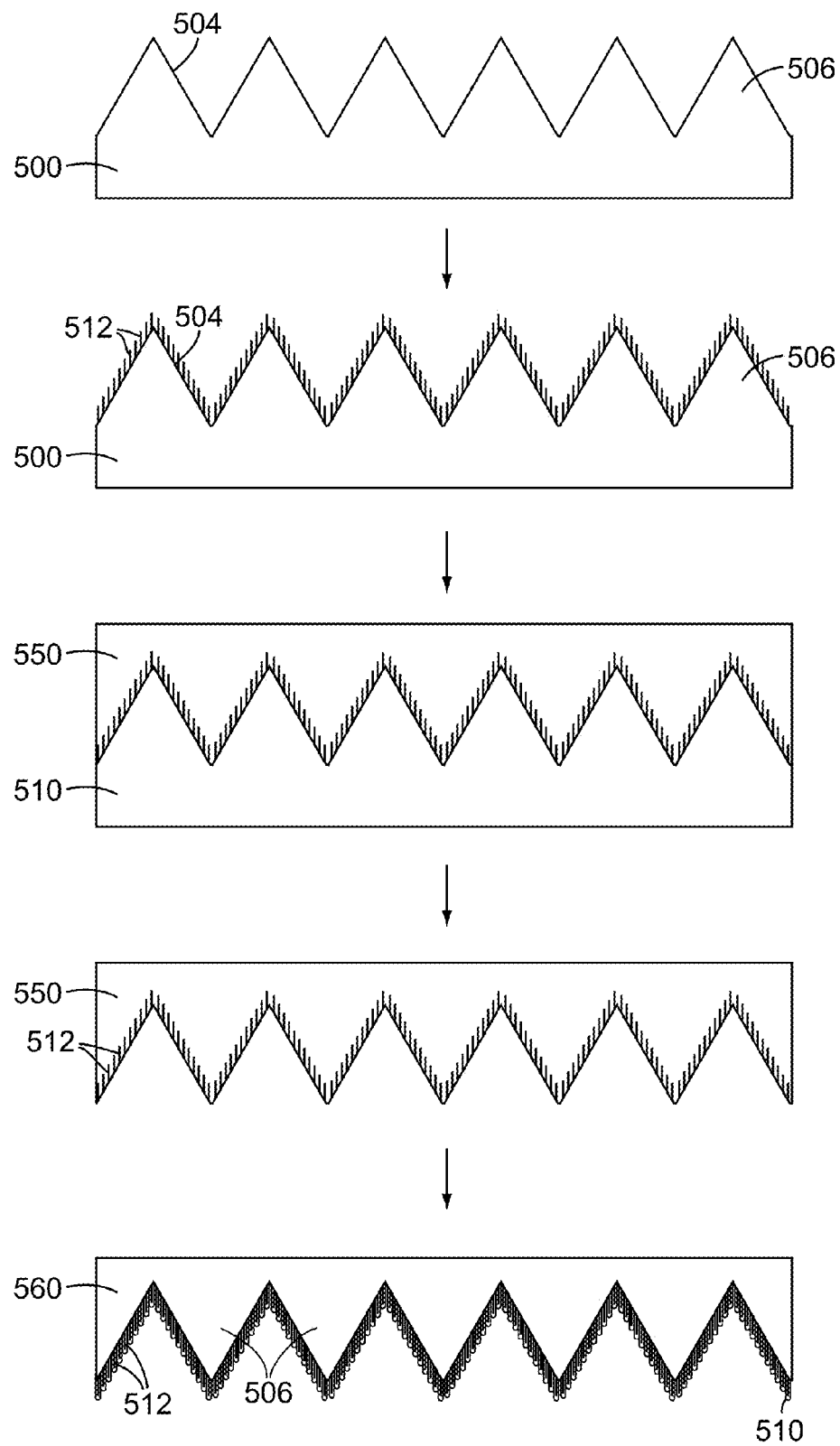
FIG. 5 is a flow chart of a method of creating a superhydrophobic film according to the present description.

In another aspect, the present description relates to methods of creating a superhydrophobic film. One such method is illustrated in FIG. 5. In the first step of the method, a first film 500 is provided. The film has a plurality of microstructures 506 located on the film's first surface 504. A layer of nanoposts 512 is applied to the film, specifically applied on top of the microstructures 506, such that the nanoposts protrude out from the microstructures 506. The nanoposts may be applied by any suitable technique that does not interfere with the orientation or structural integrity of the structures. One appropriate method of nanopost deposition is to apply a film that is pre-structured with nanoposts. Otherwise, the layer of nanoposts may also first be applied as a non-structured deposited coating. In this manner of application, an organic pigment coating is vacuum deposited on to the microstructures. Next, the organic pigment coating is annealed at an elevated temperature, preferably in vacuum. A more thorough description of this particular method may be found in U.S. Pat. No. 5,039,561, the entirety of which is hereby incorporated by reference herein. Other means for generating the nanoposts include use of physical vapor transport growth instead of vacuum vapor deposition, vacuum deposition of inorganic materials at high incidence angle, ion or rf sputter etching of polymers, semiconductors or alloys having differential sputtering rates, sputter etching of polymers using microisland masking, photolithography (UV and X-ray), and electron beam lithography, electrochemical etching of metals and electroplating of roughened metals, photofabrication on photopolymer surfaces, directional solidification and etching of eutectics, and vapor liquid solid (VLS) crystal growth.

The nanoposts are whisker-like in shape, and therefore may have a length-to-base ratio of at least 3 to 1, or at least 5 to 1, or at least 10 to 1 or at least 15 to 1 or at least 20 to 1. The nanoposts are generally longer than 500 nm. In some embodiments, the nanoposts may have a length of greater than 0.5 microns, or potentially greater than 1 micron. The length of the nanoposts may be less than 3 microns, or potentially less than 2 microns. The nanoposts 512 may, in some embodiments, be made up of a crystalline, organic material, as described with respect to the article above. However, the nanoposts 512 may also be conformally coated with a metallic coating, e.g., a platinum alloy coating, such as described above with respect to FIG. 4, or with inorganic coatings such as metal oxides, borides, nitrides, and the like The coating may be achieved by any appropriate conventional coating technique, such as sputtering, evaporation, and electron beam evaporation, just to name a few. The nanoposts may generally be formed in fairly close proximity to one another, such that the nanoposts have an average spacing of less than about 100 nm from one another. More specifically, the nanoposts may have an average spacing of between about 20 nm and about 100 nm from the closest adjacent nanopost. The nanoposts may further have an average spacing of between about 40 nm and about 60 nm. In accordance with this, the nanoposts are very densely applied, such that the nanoposts have a density on the surface of the microstructures of between about 3 billion/$cm^2$ to about 5 billion/$cm^2$.

In the next step, the first film 500 is coated in a curable composition and cured to create a negative of the first film 550. The negative of the first film 550 is then separated from the first film 500, and the nanoposts 512 remain embedded in the negative 550 after separation.

Finally, after separating the negative 550 from first film 500, the negative 550 is etched. The material of the negative 550 may be etched away at a rapid rate by an appropriate etching method, such as reactive-ion etching. However, the nanopost 512 may be coated in a slow-etching metal resulting in a slower etch of the nanoposts 512 initially embedded in negative 550. The etch therefore may result in a superhydrophobic film 560 that has a plurality of microstructures 506 and nanoposts 512, where the nanoposts are transformed from embedded to protruding by the etch process. The nanoposts have the length-to-base ratio of at least 3 to 1, at least 5 to 1, at least 10 to 1, at least 15 to 1 or at least 20 to 1. The final superhydrophobic film 560 may also have a fluorochemical coating 510 applied to it in order to even further increase the superhydrophobicity of the film.

The curable composition that, after curing, results in negative 550 may be made up of any number of suitable materials that are capable of curing in the desired microstructure shape and receiving the nanoposts without damaging them. It is also desirable in some embodiments for the curable composition to be made up of a material with desirable etching response qualities and surface energy. In some embodiments, the composition is a silicone polymer, such as PDMS.

Figure 7:
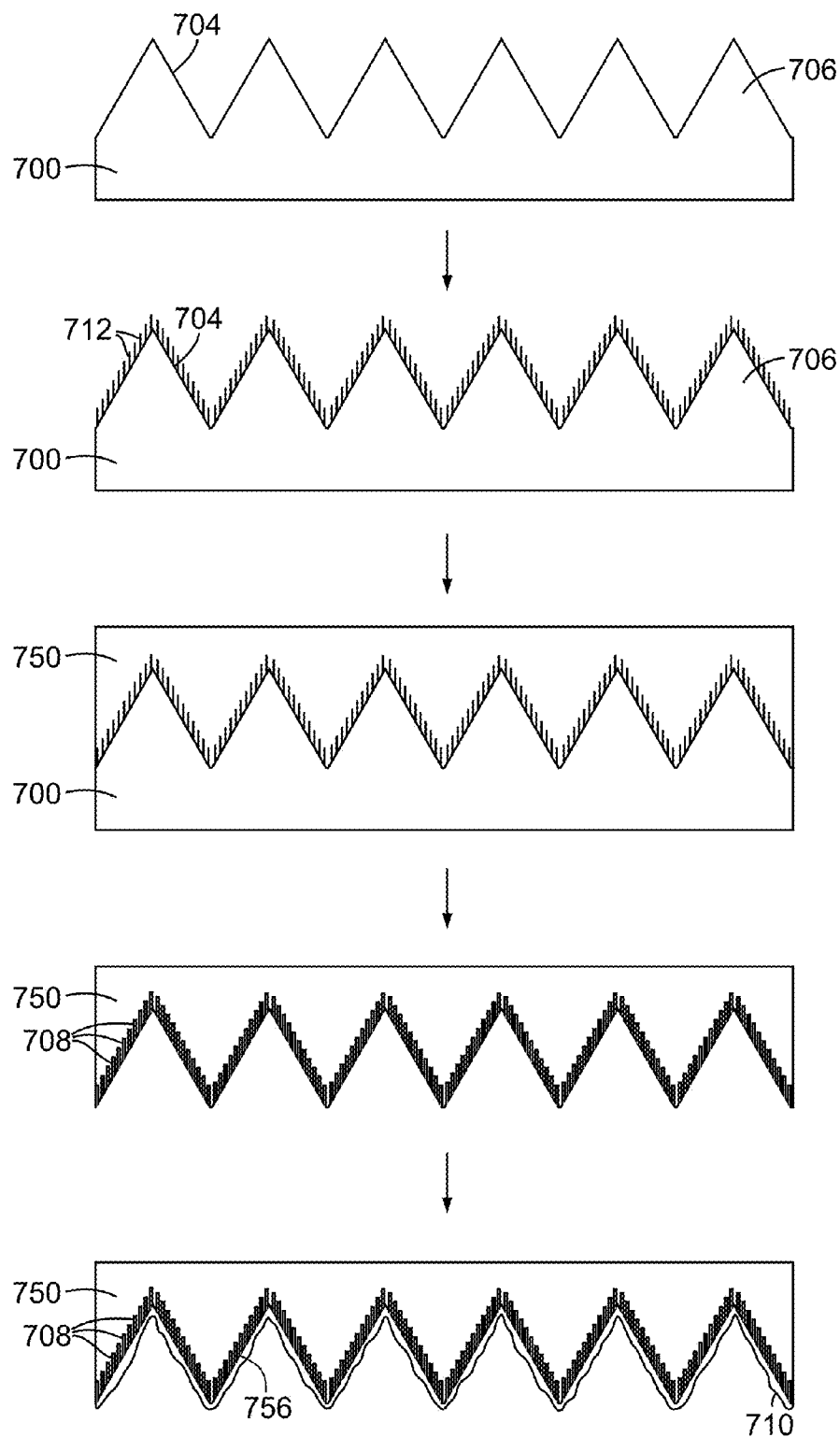
FIG. 7 is a flow chart of a method of creating a superhydrophobic film according to the present description.

Another method of creating a superhydrophobic film is illustrated in the flow chart according to FIG. 7. In this method, a first film 700 is provided that has a first surface 704. On first surface 704 are a number of microstructures 706. In the next step, a layer of easily etched nanoposts 712 are applied to the microstructures 706. The nanoposts may have a length-to-base ratio of at least 3 to 1, or at least 5 to 1, or at least 10 to 1, or at least 15 to 1, or at least 20 to 1 as calculated in accordance with the discussion of FIG. 3b. Next, the first film 700 is coated in a curable composition and the curable composition is cured to create a negative 750 of the first film. The negative 750 is next separated from the first film, with the nanoposts 712 remaining embedded in negative 750 after separation.

As opposed to the process described with respect to the flow chart in FIG. 5, no metal coating over the nanoposts 712 is contemplated. In the next step of the method shown in FIG. 7, the top surface of the negative 750 is etched away by an appropriate etch method, such as reactive ion etching or wet etching. However, due to the material of nanoposts 712, the nanoposts etch away at an even faster rate. The result of this step is a negative 750 that has a plurality of nanocavities 708 formed into the surface of negative 750. The nanocavities 708 will generally have a length-to-opening ratio that related to the length-to-base ratio of the nanopost 712 formerly located in the cavity. Therefore the nanocavities 708 may have a length-to-opening ratio of at least 3 to 1, or at least 5 to 1, or at least 10 to 1, or at least 15 to 1, or at least 20 to 1. Finally, a fluorochemical coating 710 may be applied over the surface 750 of the negative (now superhydrophobic film), and the nanocavities 708. The fluorochemical may generally correspond to the fluorochemical coatings discussed above. As with respect to the article illustrated in FIG. 1 the application of the coating 710 to the nanocavities 108 is difficult to show at this scale. In fact, the coating will once again conform to the walls of the nanocavities (as illustrated in FIG. 11 with nanocavity 1108 and coating 1110).

Figure 8:
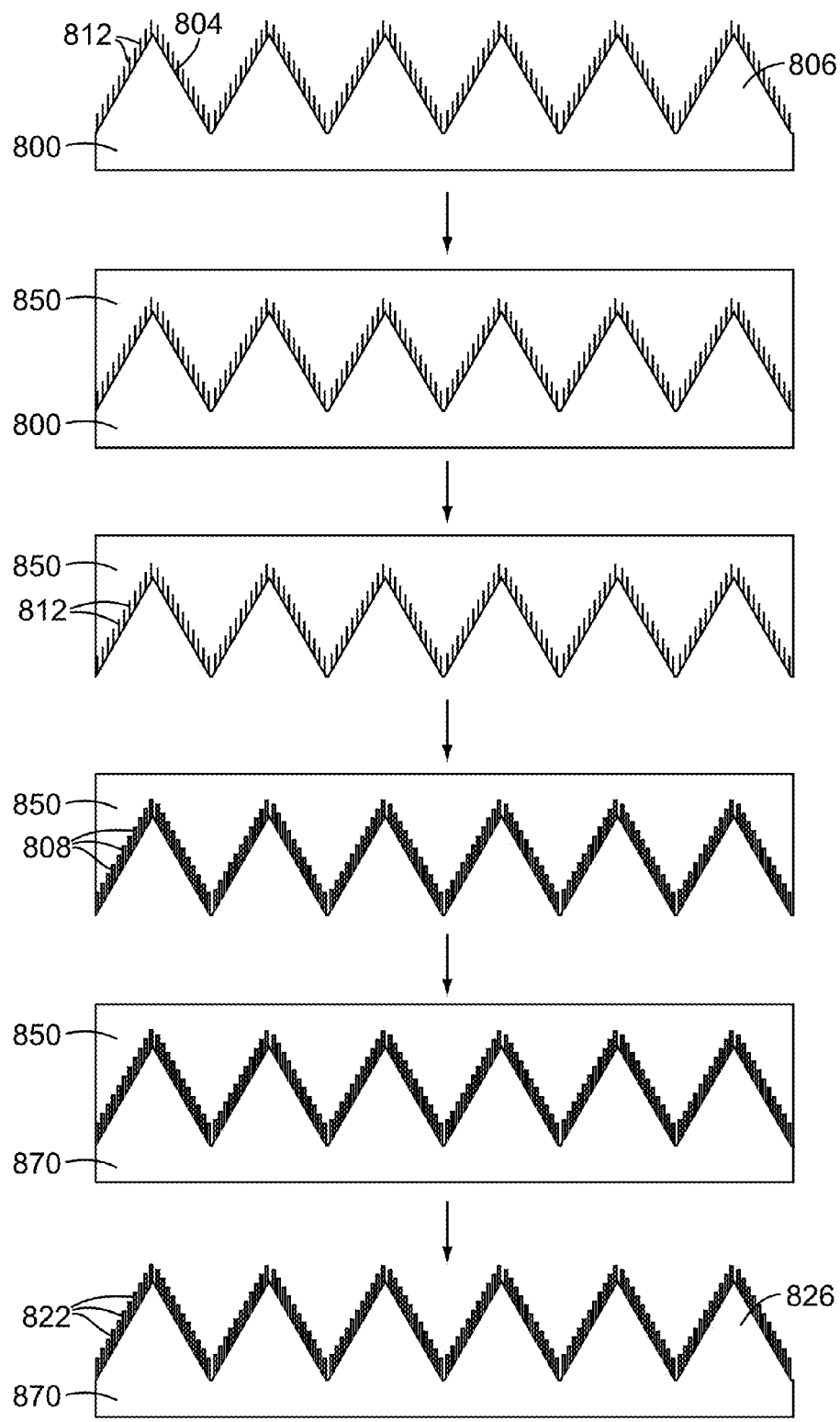
FIG. 8 is a flow chart of a method of creating a superhydrophobic film according to the present description.

In another aspect, a superhydrophobic film may be made by creating a mold that may be used to mass-replicate a number of superhydrophobic films. One such method is illustrated in FIG. 8. There, the method begins with a first film 800 have a plurality of microstructures 806 on a first surface of the film 804. A layer of nanoposts 812 is applied on each of the microstructures 806. In the next step, the first film 800 is coated with a metal coating via vacuum coating and/or plating. The metal coating may be any appropriate metal used to create molds, such as nickel. The metal mold 850 is separated from the first film 800 while the nanoposts 812 remain embedded in the mold 850. Next, the mold is etched, by either a dry etching or wet etching method. The nanoposts 812 etch at a much faster rate than the metal mold 850, and as a result, the etching step creates a metal mold 850 with a plurality of nanocavities 808. At this point, a mold for producing a number of suitable replica superhydrophobic films has been created. The next step in creating one such film is to apply a curable composition coating and cure the composition. The result is a replica that is a superhydrophobic film 870 that has a plurality of nanoposts 822 protruding from a plurality of microstructures 826. The nanoposts may have a length-to-base ratio of at least 3 to 1, or at least 5 to 1, or at least 10 to 1, or at least 15 to 1, or at least 20 to 1.

EXAMPLES

Example 1

A layer of nanoposts of PR149 on a prismatic film in which the prisms were spaced at a pitch of 6 microns were sputter coated with a platinum alloy of $Pt_{68}Co_{29}Mn_3$. The nanoposts were created by the method described in U.S. Pat. No. 5,039,561. SYLGARD 184 PDMS (available from Dow Corning, Midland Mich.) and its curing agent were mixed in a 10:1 weight ratio and degassed. The mixture was poured onto the nanoposts and cured on a hot plate at 80° C. for 1 hour. After curing, the PDMS negative was peeled off the prismatic film and the coated nanoposts remained embedded in the PDMS negative (that is, they were removed from the prismatic film). Afterwards, the PDMS negative was subjected to reactive ion etching by Model PlasmaLab System 100 (available from Oxford Instruments, Yatton, UK) to remove the PDMS material. The whiskers remained in the structures and were not etched away due to the platinum alloy coating. The following Table 1 illustrates the condition ranges for the reactive ion etches.

TABLE 1

Reactive Ion Etching Conditions

| Reactant/Condition: | Value: |
| --- | --- |
| $CHF_3$ | 0-45 sccm |
| $O_2$ | 5-40 sccm |
| RF power | 30-150 W |
| Inductive Coupling Plasma (ICP) power | 700-1800 W |
| Pressure | 80 Pa |
| Time | 50 sec. |

After reactive ion etching, the negative had the alloy-coated nanoposts protruding from the etched PDMS. The film was then dip-coated in HFPO and heated on a hot plate at 120° C. for 30 minutes.

The following Table 2 illustrates the water contact angles and roll-off angles produced according to the above specification with four negatives etched at differing $CHF_3:O_2$ ratios. The "roll-off angle" is a comparable measurement to the sliding angle. A tilt angle (the angle of the liquid-solid interfacial line) for a water drop on the above sample was conducted. The sample was placed on the Automated Tilting Base and adjusted for leveling with a bubble level. Then 5 uL DI water was delivered using a 10 uL syringe. The tilting base was then turned-on manually and off when the water droplet rolls off. The tilt angle was recorded and the tilt base back to 0° for next measurement.

TABLE 2

Performance of negatives with differing etchant ratios

| $CHF_3:O_2$ | Water Contact Angle | Roll-Off Angle |
| --- | --- | --- |
| 0:45 sccm | 139° | ~60° |
| 5:40 sccm | 154° | <1° |
| 20:25 sccm | 156° | <1° |
| 40:5 sccm | 158° | <1° |

Example 2

Nanoposts of PR149 (created by the method described in U.S. Pat. No. 5,039,561) on a prismatic film were coated with a 150 nm Al layer. The prisms were spaced at a pitch of 6 micron. SYLGARD 184 PDMS and its curing agent were mixed in a 10:1 weight ratio and degassed. The mixture was poured onto the nanoposts and cured on a hot plate at 80° C. for 1 hour. After curing, the PDMS negative was peeled off the prismatic film and the nanoposts remained in the PDMS negative. Before dry etching of the whiskers, the 150 nm Al layer was first etched off by a wet etch ($H_4PO_3$/ $HNO_3$/glacial acetic acid) for 3 minutes. Next, the PDMS negative was subjected to reactive ion etching removing the embedded nanoposts from the negative using the systems and conditions described in Example 1 leaving behind nanocavities where the nanoposts had been. The samples showed water contact angles of up to 151° and roll-off angles less than 1°.

Example 3

Nanoposts of PR149 (created by the method described in U.S. Pat. No. 5,039,561) on a prismatic film were coated with a 150 nm Al layer. The prisms were spaced at a pitch of 6 microns. A silver mirror reaction was conducted to make the nanoposts conductive after which nickel electroforming was performed to replicate the structures from the starting structure. A sulfamate nickel bath was used at a temperature of 130° F. and a current density of 0.02 amps/sq. cm to deposit the nickel. The final thickness of nickel deposit was about 0.5 mm. After electroforming was completed, the nickel mold was separated from the starting structure with the nanoposts embedded within. Next, the Nickel mold was subjected to reactive ion etching removing the embedded nanoposts from the negative using the systems and conditions described in Examples 1 and 2. The result was a mold that served as a negative of the starting structure. The nickel was then coated with an HFPO release agent.

SYLGARD 184 PDMS and its curing agent were mixed in a 10:1 weight ratio and degassed. The mixture was poured onto the nickel mold and cured on a hot plate at 80° C. for 1 hour. After curing the PDMS replica was peeled off the nickel mold. The resulting PDMS replica had nanoposts superimposed on microstructures. The PDMS replica was performance tested and exhibited a water contact angle of 151° and roll-off angle that was less than 1°.

Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

We claim:

1. A method of creating a superhydrophobic film, comprising:
    providing a first film, the film comprising a plurality of microstructures on a first surface of the film and a layer of nanoposts on the microstructures;
    coating the first film with a metal coating to create a metal mold of the first film;
    separating the mold from the first film, wherein the nanoposts of the first film remain embedded in the mold after separating the mold;
    etching the mold, such that the nanoposts embedded are etched away resulting in nanocavities in the mold; and
    coating the etched mold with a curable composition, curing the composition to create a replica, and separating the replica to create a superhydrophobic film.

2. The method of claim 1, wherein the etching is reactive ion etching.

3. The method of claim 1, wherein the metal coating is applied by vacuum coating or plating.

4. A method of creating a superhydrophobic film, comprising:
    providing a first film, the film comprising a plurality of microstructures on a first surface of the film;
    applying a layer of nanoposts;
    coating the first film in a curable composition, and curing the composition to create a negative of the first film;
    separating the negative from the first film, wherein the nanoposts of the first film remain embedded in the negative after separation; and
    etching the negative, resulting in a superhydrophobic film with a plurality of microstructures and nanocavities, the nanocavities having a length-to-opening ratio of at least 5 to 1.

5. The method of claim 4, wherein the nanoposts are produced by self-assembling through annealing of a vacuum deposited organic pigment coating.

6. The method of claim 4, wherein the nanocavities having a length-to-opening ratio of at least 10 to 1.

* * * * *